United States Patent
Akashi

(10) Patent No.: US 10,168,472 B2
(45) Date of Patent: Jan. 1, 2019

(54) OPTICAL RECEPTACLE, OPTICAL COMMUNICATIONS TRANSCEIVER MODULE, AND METHOD FOR PRODUCING OPTICAL RECEPTACLE

(71) Applicant: Kyocera Corporation, Kyoto-shi, Kyoto (JP)

(72) Inventor: Tomoyoshi Akashi, Kitami (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/655,397

(22) Filed: Jul. 20, 2017

(65) Prior Publication Data
US 2017/0315303 A1 Nov. 2, 2017

Related U.S. Application Data

(63) Continuation of application No. PCT/JP2016/051141, filed on Jan. 15, 2016.

(30) Foreign Application Priority Data

Jan. 22, 2015 (JP) .................................. 2015-010473

(51) Int. Cl.
*G02B 6/36* (2006.01)
*G02B 6/10* (2006.01)
(Continued)

(52) U.S. Cl.
CPC .................. *G02B 6/10* (2013.01); *G02B 6/24* (2013.01); *G02B 6/36* (2013.01); *G02B 6/3825* (2013.01);
(Continued)

(58) Field of Classification Search
USPC ..................................................... 385/78–83
See application file for complete search history.

(56) References Cited

U.S. PATENT DOCUMENTS 5,703,982 A * 12/1997 Takizawa ............. G02B 6/3869
385/60
6,273,619 B1 * 8/2001 Shahid ................. G02B 6/3874
385/55
(Continued)

FOREIGN PATENT DOCUMENTS

CN 203259689 U 10/2013
JP S60-110807 U 7/1985
(Continued)

OTHER PUBLICATIONS

International Search Report (Form PCT/ISA/210) dated Apr. 19, 2016, issued for PCT/JP2016/051141.
(Continued)

*Primary Examiner* — Eric Wong
(74) *Attorney, Agent, or Firm* — Volpe and Koenig, P.C.

(57) ABSTRACT

An optical receptacle includes an optical component assembly, a tubular sleeve, and a tubular shell. The optical component assembly includes a light guide member, a tubular member, which retains the light guide member in the through hole, and projections, which extends outward of an outer peripheral surface of the tubular member at one end. The sleeve is fitted to the outer periphery of the light guide member at a rear end portion. The inside diameter of a front portion of the sleeve differs from that of the rear end portion. The shell covers the outer peripheral surface of the sleeve and includes a groove in a rear end portion. The groove extends in an axial direction and turns and extends in a circumferential direction. The groove is engaged with the projections of the tubular member to secure the shell. The shell and the sleeve are attachable and detachable.

7 Claims, 5 Drawing Sheets

(51) Int. Cl.
*G02B 6/42* (2006.01)
*H01L 31/0232* (2014.01)
*G02B 6/24* (2006.01)
*G02B 6/38* (2006.01)

(52) U.S. Cl.
CPC ............ *G02B 6/3846* (2013.01); *G02B 6/42* (2013.01); *G02B 6/421* (2013.01); *G02B 6/4246* (2013.01); *H01L 31/0232* (2013.01)

(56) References Cited

U.S. PATENT DOCUMENTS

| | | | |
|---|---|---|---|
| 9,810,863 B2 * | 11/2017 | Akashi | G02B 6/421 |
| 2005/0220424 A1 * | 10/2005 | Asano | G02B 6/3812 385/78 |
| 2006/0078261 A1 | 4/2006 | Endou et al. | |
| 2015/0378107 A1 * | 12/2015 | Akashi | G02B 6/421 398/139 |

FOREIGN PATENT DOCUMENTS

| | | |
|---|---|---|
| JP | S61-073108 U | 5/1986 |
| JP | H05-021211 U | 3/1993 |
| JP | 2000-180668 A | 6/2000 |
| JP | 2004-117917 A | 4/2004 |
| JP | 2004-287198 A | 10/2004 |
| JP | 2006-106680 A | 4/2006 |
| JP | 2009-098603 A | 5/2009 |
| JP | 2009-265507 A | 11/2009 |
| WO | 2015/012183 A1 | 1/2015 |

OTHER PUBLICATIONS

Written Opinion dated Apr. 19, 2016, issued for PCT/JP2016/051141.

* cited by examiner

OPTICAL RECEPTACLE, OPTICAL COMMUNICATIONS TRANSCEIVER MODULE, AND METHOD FOR PRODUCING OPTICAL RECEPTACLE

TECHNICAL FIELD

The present invention relates to an optical receptacle, an optical communications transceiver module, and a method for producing an optical receptacle. The optical receptacle is adaptable to a variety of optical connectors including subscriber connectors (SC type) and lucent connectors (LC type), which are used as components for coupling optical fibers to each other. The optical communications transceiver module includes the optical receptacle and a light emitting element or a light receiving element. The method includes assembling, via conversion, an optical receptacle for the SC type or the LC type, for example.

BACKGROUND ART

Optical communications transceiver modules are used in two-way communication over optical fiber. The optical communications transceiver module includes, in a small package, an optical transceiver circuit including a light emitting element, such as a laser diode (LD), or a light receiving element, such as a photodiode (PD). Also, the optical communications transceiver module includes an optical receptacle portion attached to a case of the small package. An optical fiber can be coupled to the optical receptacle portion to enable communication with an optical communications transceiver module at the other party.

A conventional optical communications transceiver module includes an optical receptacle portion and an optical element device portion.

The optical element device portion contains an optical element, e.g., a light emitting element such as an LD or a light receiving element such as a PD. The optical element device portion is secured to a holder of the optical receptacle portion via an adapter.

The optical receptacle portion includes the holder, a fiber stub, a sleeve, and a sleeve cover. In the fiber stub, an optical fiber is inserted along the central axis. The sleeve has a cylindrical shape and is attached to cover the front end of the fiber stub. The holder holds the fiber stub inside and holds the outer peripheral surface of the sleeve cover at a lower portion thereof. The sleeve cover is secured to the holder by press-fitting or by adhesive bonding so as to cover the sleeve. The sleeve cover is also referred to as a shell.

An optical connector can be coupled to the optical receptacle portion in such a manner that a plug ferrule within the optical connector is guided by the sleeve to bring the end surface of the ferrule and the end surface of the fiber stub into contact with each other while being aligned along the central axis. This brings the optical fiber within the ferrule and the optical fiber within the fiber stub into contact with each other to couple the optical signals.

The sleeve cover 114 of the optical receptacle portion is made of a non-metallic material, e.g., zirconia ceramic material. Other materials often used for the sleeve cover include metal materials such as special use stainless steel (SUS). The sleeve cover is secured by being press-fitted, at a lower portion thereof, to the holder. Some sleeve covers are designed to be secured to the holder by an adhesive. However, in view of tightness of securement, and because of consistency of the tight securement obtained, for example, the technique of securing the sleeve cover to the holder by pressfitting is often employed.

The optical receptacle portion, the sleeve cover is made of a non-metallic material, and therefore the sleeve cover will not act as a noise antenna.

CITATION LIST

Patent Literature

Patent Literature 1: Japanese Unexamined Patent Application Publication No. 2006-106680A

SUMMARY OF INVENTION

Technical Problem

Plug ferrules often employed for optical connectors include two types, having different diameters. The plug ferrules include those of 2.5 mm in diameter, which are used in, for example, SC type connectors, and those of 1.25 mm in diameter, which are used in, for example, LC type connectors. For correct fitting to the plug ferrule, the fiber stub 112, which is inserted in the inner hole of the sleeve 113, also has a diameter with high accuracy such as to correspond to the diameter of the plug ferrule.

Conventionally, for various types of optical connectors including plug ferrules of different diameters, a dedicated optical receptacle portion 110 is prepared for each of them and is combined with an optical element device portion 120 to provide an optical communications transceiver module 100 for each of them.

However, for rapid delivery of the optical communications transceiver module 100 in response to an order, it is necessary to always keep in stock two types of optical communications transceiver modules 100 to meet the order, and as a result, the problem of overstocking arises.

Note that as for the conventional optical receptacle 110, in many cases, the sleeve cover 114 and the holder 111 are assembled together by press-fitting. The process of press-fitting requires the use of a machine in the plant for the optical receptacle 110. Because of the highly tight securement, manually detaching or reattaching the sleeve cover 114 and the holder 111 is very difficult. Thus, it is necessary to keep in stock two types of optical communications transceiver modules 100 each including a different type of optical receptacle portion 110, which is assembled in the plant.

In view of the foregoing problems, an object of the present invention is to provide an optical receptacle that is convertible and thus is adaptable to any of various types of optical connectors, and to provide an optical communications transceiver module that includes the optical receptacle and is convertible.

Solution to Problem

According to an embodiment of the present invention, an optical receptacle includes an optical component assembly, a sleeve, and a shell. The optical component assembly includes a light guide member, a tubular member, and a projection. The tubular member retains the light guide member in a through hole of the tubular member. The projection extends outward of an outer peripheral surface of the tubular member at one end thereof. The sleeve has a tubular shape and is fitted to an outer periphery of the light guide member at a rear end portion of the sleeve. The sleeve has an inside diameter at a front end portion different from an inside diameter at the rear end portion. The shell has a tubular shape and covers an outer peripheral surface of the sleeve. The shell includes a groove in a rear end portion of the shell. The groove extends in an axial direction and turns and extends in a circumferential direction. The groove is engaged with the projection of the tubular member to secure the shell.

In the optical receptacle, the inside diameter of the front end portion of the sleeve is sized to allow the front end portion to fit to a 2.5 mm diameter ferrule.

Furthermore, in the optical receptacle, the inside diameter of the rear end portion of the sleeve is sized to allow the rear end portion to fit to a 1.25 mm diameter ferrule.

Furthermore, in the optical receptacle, the light guide member is a fiber stub including a ferrule and an optical fiber inserted through the ferrule.

In the optical receptacle, the ferrule is a 1.25 mm diameter ferrule.

According to an embodiment of the present invention, an optical communications transceiver module includes the optical receptacle and an optical communications package secured to the tubular member and including an optical element inside the optical communications package.

According to an embodiment of the present invention, a method for producing an optical receptacle is as follows. The shell of the optical receptacle is rotated in a circumferential direction and thereafter pulled in an axial direction to release engagement between the projection of the optical component assembly and the groove of the shell. Then, the sleeve is pulled out. Then, another sleeve is mounted to the light guide member. The another sleeve has an inside diameter different from the inside diameters of the sleeve. Thereafter, a groove of another shell is brought into engagement with the projection of the optical component assembly. The another shell covers the another sleeve. The groove is disposed in a rear end portion of the another shell. The rear end portion of the another shell and the rear end portion of the shell have a similar shape. In this manner, another optical receptacle is assembled via conversion.

Furthermore, according to an embodiment of the present invention, a method for producing an optical receptacle is as follows. The another shell of the optical receptacle is rotated in a circumferential direction and thereafter pulled in an axial direction to release engagement between the projection of the optical component assembly and the groove of the another shell. Then, the another sleeve is pulled out. Then, the sleeve is mounted to the light guide member. Thereafter, the groove of the shell is brought into engagement with the projection of the optical component assembly. In this manner, the optical receptacle is assembled via conversion.

Advantageous Effects of Invention

In the optical receptacle according to an embodiment of the present invention, the optical component assembly includes a tubular member and a light guide member retained by the tubular member. The tubular member includes a projection extending outward of an outer peripheral surface of the tubular member at one end thereof. The rear end portion of the sleeve is fitted to the light guide member. The sleeve has a tubular shape, and the inside diameter of the front end portion differs from the inside diameter of the rear end portion. The optical receptacle includes a tubular shell including a groove in a rear end portion thereof. The groove extends in an axial direction and turns and extends in a circumferential direction. The groove is engaged with the projection of the tubular member to secure the shell. In the optical receptacle, the tubular shell and sleeve are easily detached and reattached. Thus, after the optical receptacle is assembled into an optical communication transceiver module, the sleeve and the shell can be detached and reattached and therefore the optical receptacle is convertible.

As for the optical receptacle, in the case where the inside diameter of the front end portion of the sleeve is sized to allow the front end portion to fit to a 2.5 mm diameter ferrule, good coupling is achieved with, for example, an SC type optical connector including a 2.5 mm diameter plug ferrule.

As for the optical receptacle, in the case where the inside diameter of the rear end portion of the sleeve is sized to allow the rear end portion to fit to a 1.25 mm diameter ferrule, a small light guide member can be used.

As for the optical receptacle, in the case where the light guide member is a fiber stub including a ferrule and an optical fiber inserted through the ferrule, the light guide member has good coupling characteristics.

As for the optical receptacle, in the case where the ferrule is a 1.25 mm diameter ferrule, a sleeve that can fit to a 1.25 mm ferrule can be inserted and used.

The optical communications transceiver module according to an embodiment of the present invention includes one of the above-described optical receptacles. Thus, the optical communications transceiver module is provided which includes an optical receptacle that is convertible for plug ferrules having different diameters.

Furthermore, in the optical receptacle, the engagement between the projection of the optical component assembly and the groove of the shell can be released by rotating the shell in a circumferential direction and thereafter pulling the shell in an axial direction. Then, the sleeve can be pulled out. Then, another sleeve having a different diameter can be mounted to the light guide member. Then, a groove of another shell can be brought into engagement with the projection of the optical component assembly. The another shell covers the another sleeve. The rear end portion of the another shell and the rear end portion of the shell have a similar shape. Thus, the optical receptacle is convertible to another optical receptacle. Thus, even after being assembled into an optical communications transceiver module, the shell and the sleeve can be replaced, and therefore the optical receptacle portion can be converted to an optical receptacle of a standard using another sleeve and another shell and assembling can be performed.

Furthermore, in the optical receptacle, the engagement between the projection of the optical component assembly and the groove of the another shell can be released by rotating the another shell in a circumferential direction and thereafter pulling the another shell in an axial direction. Then, the another sleeve can be pulled out. Then, the sleeve can be mounted to the light guide member. Then, the groove of the shell can be brought into engagement with the projection of the optical component assembly. Thus, the optical receptacle is convertible. Thus, even after being assembled into an optical communications transceiver module, the another shell and the another sleeve can be replaced. Thus, an optical receptacle portion that conforms to a different standard can be assembled.

DESCRIPTION OF EMBODIMENTS

Examples of embodiments of the present invention are described below with reference to the drawings. Throughout the drawings, like elements are referred to by like designations and are assigned like numerals.

Figure 1:
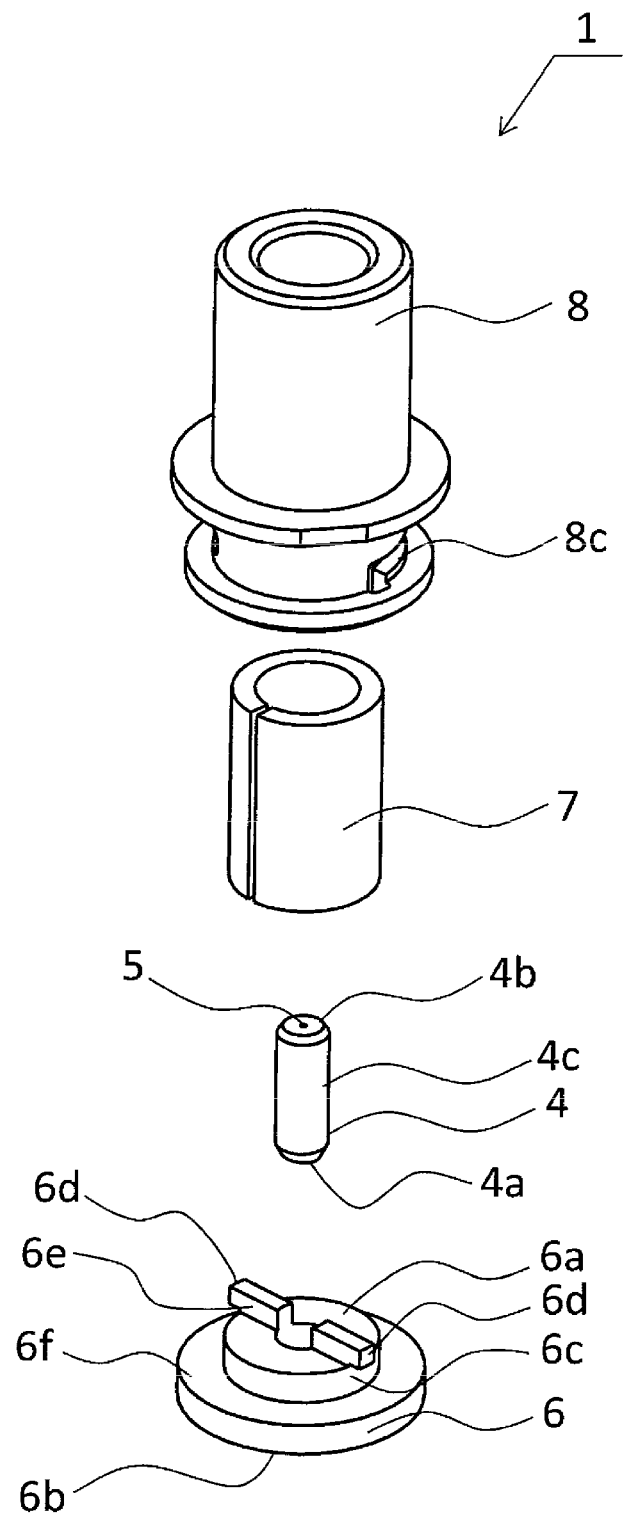
FIG. 1 is an exploded perspective view of an optical receptacle according to an example of an embodiment of the present invention.
Figure 2:
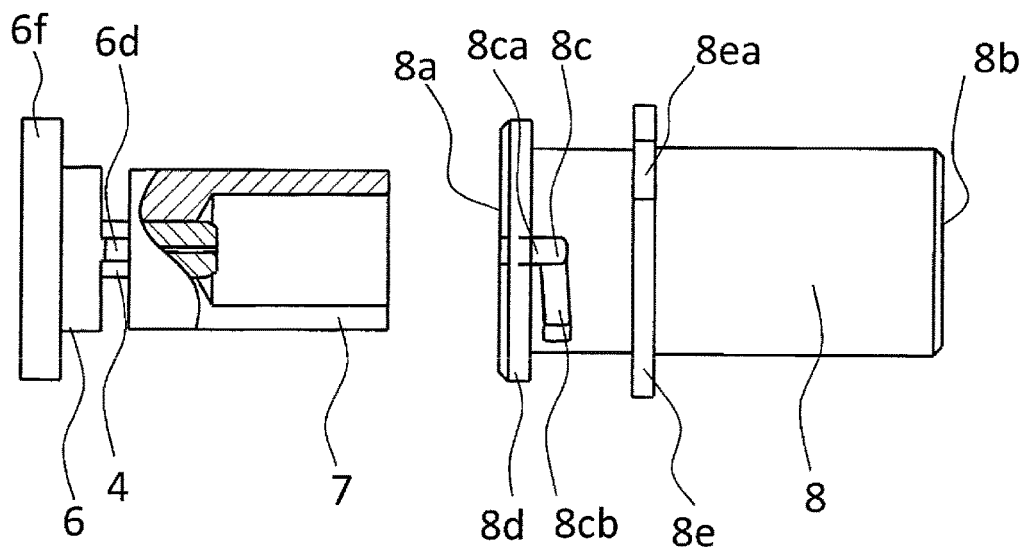
FIG. 2 is a partially exploded side view of the optical receptacle illustrated in FIG. 1.
Figure 3:
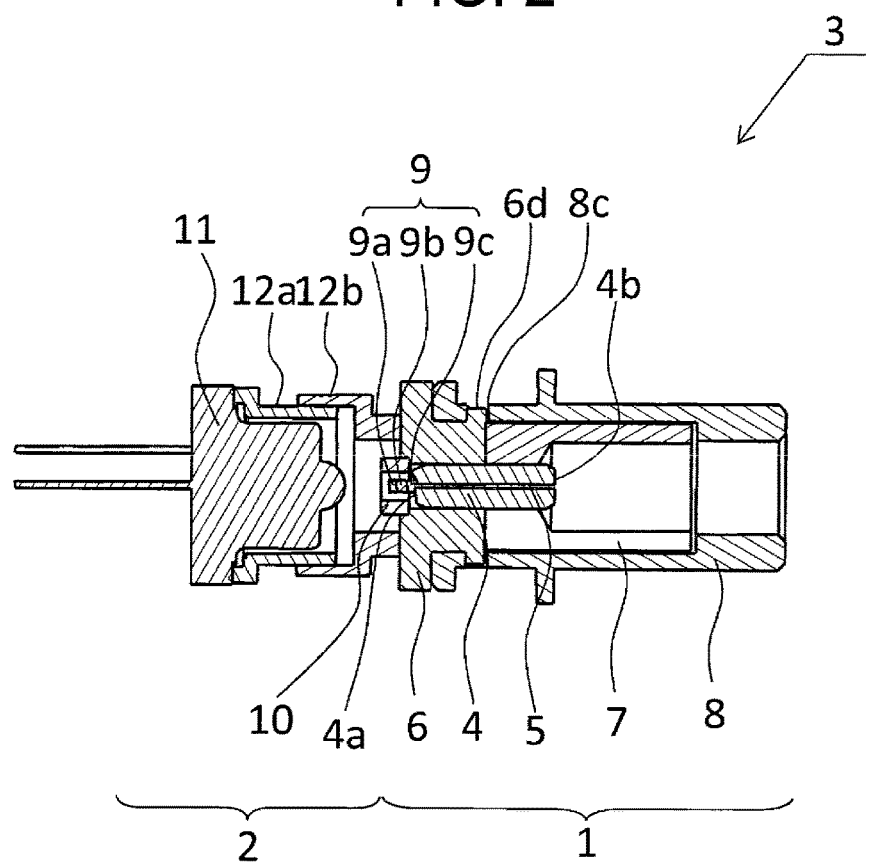
FIG. 3 is a cross-sectional view of an optical communications transceiver module according to an example of an embodiment of the present invention, with the module including the optical receptacle illustrated in FIG. 1.

FIG. 1 is an exploded perspective view of an example of an optical receptacle 1 according to an embodiment of the present invention. FIG. 2 is a side view of the optical receptacle 1, with a tubular member 6, a light guide member (fiber stub) 4, and a sleeve 7, which are illustrated in FIG. 1, assembled together and with a shell 8 not yet assembled thereto. FIG. 3 is a cross-sectional view of an optical communications transceiver module 3 in a cross-section containing the central axis. The optical communications transceiver module 3 includes the optical receptacle 1. In FIG. 3, the interior of an optical communications package 11 is hatched and not illustrated in detail.

According to an embodiment, the optical receptacle 1 includes an optical component assembly, which includes the light guide member 4 and the tubular member 6 in combination. The optical receptacle 1 is formed by the optical component assembly combined with the sleeve 7 and the shell 8.

The tubular member 6 is produced by processing a metal, ceramics, or a resin, for example. The tubular member 6 is a component having a generally cylindrical shape and has a through hole along the central axis. The tubular member 6 includes, at one end 6a, projections 6d, which extend outward of an outer peripheral surface 6c. Also, the tubular member 6 may include, at an other end 6b, a flange portion 6f, which has a larger diameter.

In an embodiment of the present invention illustrated in FIGS. 1 and 2, the tubular member 6 includes, on the end surface of the one end 6a, a protruding portion 6e, which projects in an axial direction of the tubular member 6. The side surfaces of the protruding portion 6e are surfaces contiguous with the outer peripheral surface 6c and are formed as portions of the outer peripheral surface 6c. The projections 6d extend from the side surfaces of the protruding portion 6e outward of the outer peripheral surface 6c.

Alternatively, the shape of the projections 6d may be such that the protruding portion 6e is not provided and the projections 6d simply extend from the outer peripheral surface 6c at the one end 6a of the tubular member 6.

The protruding portion 6e and the projections 6d illustrated in FIGS. 1 and 2 can be formed as follows. The tubular member 6, while being rotated about the central axis, is processed into a shape having a flange. The flange has an outer periphery that corresponds to a radial length conforming to the projecting length of the projections 6d. Subsequently, the surface of the one end 6a is partly cut in the axial direction while leaving portions for the protruding portion 6e and the projections 6d. Processing in this manner facilitates the processing of the protruding portion 6e and the projections 6d of the tubular member 6.

Figure 4:
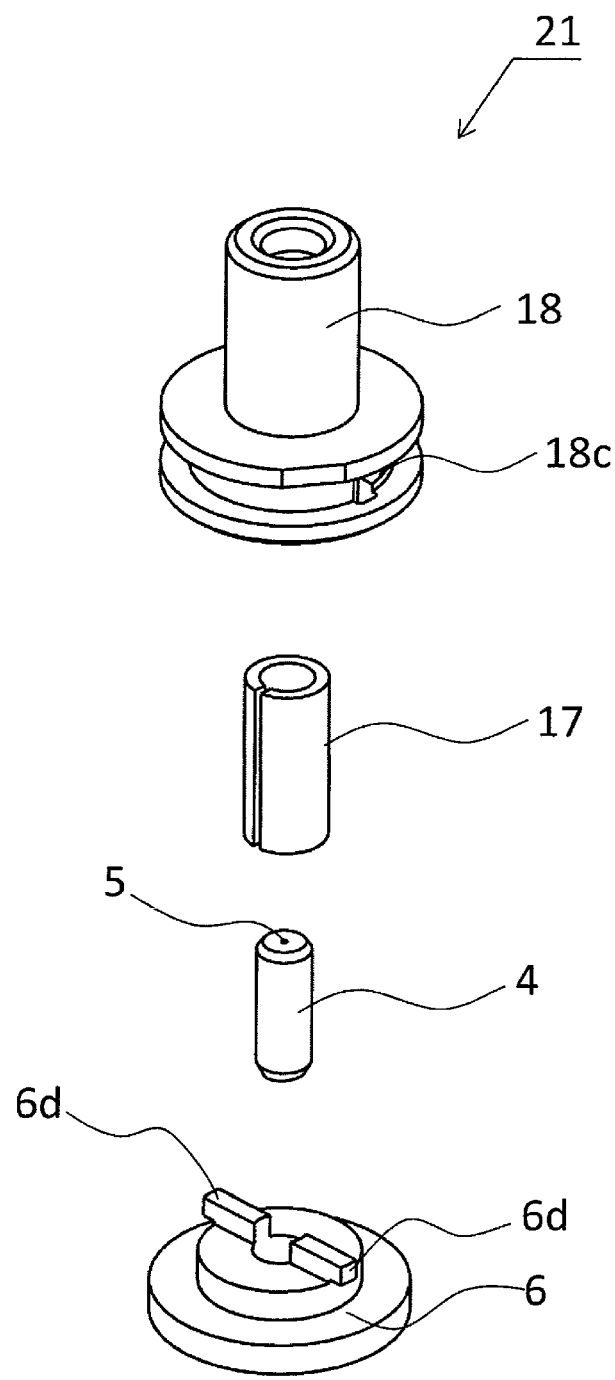
FIG. 4 is an exploded perspective view of an optical receptacle of another example according to an embodiment of the present invention.
Figure 5:
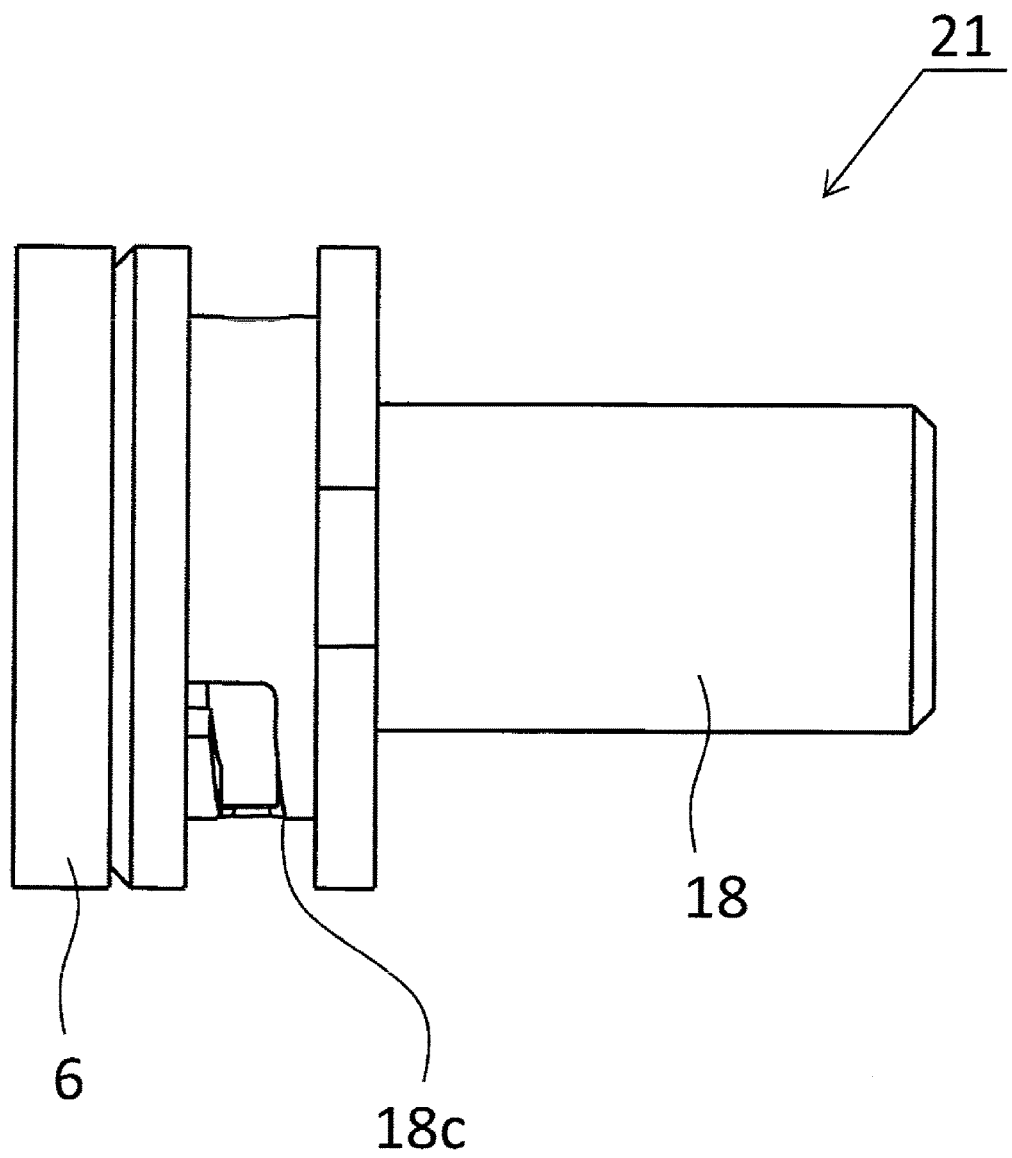
FIG. 5 is a side view of the optical receptacle illustrated in FIG. 4 in an assembled state.
Figure 6:
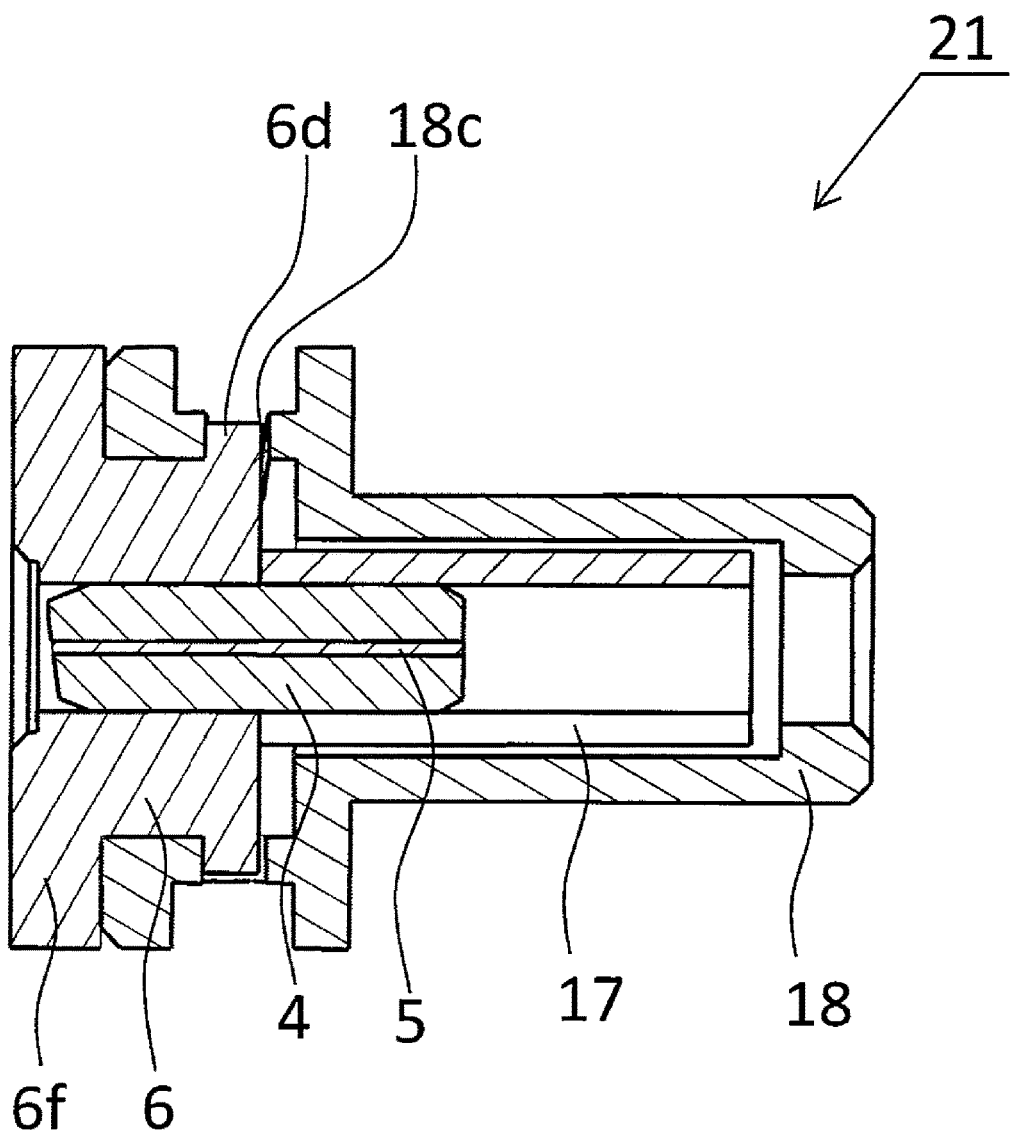
FIG. 6 is a cross-sectional view of the optical receptacle illustrated in FIG. 5.

Preferably, the projections 6d are provided on the outer peripheral surface 6c, at least two symmetrical locations with respect to the axis of the tubular member 6. When a plurality of the projections are to be provided, they are preferably provided at locations equally spaced along the outer peripheral surface 6c. For example, when they are to be provided at three locations, they are preferably provided at the vertices of an equilateral triangle, so that each location is spaced apart at an angle of 120°. FIGS. 1 and 4 illustrate examples in which the projections 6d are provided at two locations with respect to the central axis of the tubular member 6. As described above, the projections 6d are preferably provided at at least two locations to stabilize the securement of the shell 8. Furthermore, the shell 8 can be secured so as to prevent tilting of the axis.

The light guide member 4 has the function of transmitting light. FIGS. 1, 2, and 3 illustrate an example in which a fiber stub 4 is used, but instead, a glass plate, a molded glass body, or a transparent crystalline body, for example, may be used. The fiber stub 4 includes an optical fiber 5 inserted through a central hole of a cylindrical stub ferrule 4c from the rear end 4a to the front end 4b. The following describes an example in which the fiber stub 4 is used as the light guide member 4, and the light guide member 4 is also referred to as fiber stub 4.

The stub ferrule 4c is a metal member or an electrically insulating member having a tubular shape and has a narrow through hole along the central axis. The optical fiber 5 is inserted through the hole over the entire length of the stub ferrule 4c. The rear end portion of the fiber stub 4 is secured to the inner hole of the tubular member 6 by press-fitting or by adhesive-bonding to be held by the tubular member 6. The rear end portion includes the rear end surface 4a.

Ferrules often employed as the stub ferrule 4c include two types, namely, those of 1.25 mm in diameter (outside diameter) and those of 2.5 mm in diameter (outside diameter). The actual 1.25 mm diameter ferrules have a diameter of 1.249±0.0007 mm or a diameter of 1.249±0.0005 mm. Also, the actual 2.5 mm diameter ferrules have a diameter of 2.499±0.0005 mm. In the embodiment, among these, an all-zirconia cylindrical ferrule of 1.25 mm in diameter is mainly used.

The rear end surface 4a of the fiber stub 4 is preferably an inclined surface at least a portion of which is inclined with respect to a plane normal to the axis of the fiber stub 4. The inclined surface portion of the rear end surface 4a is a surface including an incident/exit end surface of the optical fiber 5. In the fiber stub 4 illustrated in FIG. 3, the entire surface of the rear end surface 4a is an inclined surface. Alternatively, for example, a protruding portion may be formed on a middle region of the end surface of the fiber stub 4, and the rear end surface 4a of the protruding portion may be the inclined surface.

When securing the fiber stub 4 to the tubular member 6, the fiber stub 4 and the tubular member 6 are preferably secured in such a manner that the inclination direction of the rear end surface 4a and the projecting direction of the projections 6d have a certain positional relationship with each other. For example, the fiber stub 4 illustrated in FIG. 3 is secured in such a manner that the inclination direction of the rear end surface 4a and the projecting direction of the projections 6d are parallel to each other. Thus, the inclination direction of the inclined surface of the fiber stub 4 can be determined from outside by the projecting direction of the projections 6*d*.

In some cases, an optical isolator 9 is disposed at the rear end surface 4*a* of the fiber stub 4. An optical isolator element 9 is, for example, formed by a polarizer 9*a*, a Faraday rotator 9*b*, and an analyzer 9*c* that are bonded to one another in that order. Rotation alignment is performed so that the transmittance polarization planes of the polarizer 9*a* and the analyzer 9*c* form an angle of 45°, and an adhesive is applied to bond them each other. Then, cutting is performed to produce pieces of a parallelepiped shape sized to be received inside the outer periphery of the rear end surface 4*a* of the fiber stub 4.

The cut optical isolator element 9 is secured to the rear end surface 4*a* of the fiber stub 4 by adhesive bonding, for example. When a liquid adhesive is dropped onto the rear end surface 4*a* of the fiber stub 4, the adhesive spreads over the rear end surface 4*a* while forming a spherical shape because of the surface tension of the adhesive. When the optical isolator element 9 is placed thereon, the surface tension of the adhesive causes the optical isolator element 9 to move to a central position of the rear end surface 4*a*. Thus, the optical isolator element 9 may be pressed against and brought into close contact with the rear end surface 4*a* at such a position, and the adhesive may be allowed to cure. An end surface of the optical fiber 5 is located at the central position of the rear end surface 4*a*, and thus the optical isolator 9 is disposed on the optical path of the fiber stub 4.

It is sufficient that the optical isolator element 9 be located on the optical path of the fiber stub 4. For example, in the above example, the optical isolator element 9 is disposed on the rear end surface 4*a*, but instead, a groove transverse to the optical fiber 5 may be formed in a middle region in an axial direction of the fiber stub 4 and the optical isolator device 9 may be disposed in the groove.

As illustrated in FIG. 3, the optical isolator element 9 may be a parallelepiped body having an incident surface, an exit surface, and side surfaces. The incident surface and the exit surface may be inclined with respect to a plane normal to the optical axis at a predetermined angle in accordance with the inclination angle of the rear end surface 4*a*, and the side surfaces may be parallel to the optical axis. The rear end surface 4*a* is a surface inclined with respect to a plane normal to the optical axis and thus, in this case, the rear end surface 4*a* has an elliptical shape. Accordingly, the light incident surface and the exit surface of the optical isolator element 9 may be rectangular and, for example, the long side may have a predetermined angle with respect to the polarization angle and may be oriented along the direction of the major axis of the rear end surface 4*a*, and in this manner, bonding may be performed.

Furthermore, the optical isolator element 9 may be bonded to the rear end surface 4*a* so that a certain positional relationship will exist between the direction of the long side and the projections 6*d*. The angle of the polarization plane of the optical isolator element 9 can be easily determined by the projecting direction of the projections 6*d*. In some cases, a magnet 10 may be disposed around the optical isolator element 9. The magnet 10 applies a magnetic field to the Faraday rotator 9*b*. Strictly speaking, a component including the magnet 10 in addition to the optical isolator element 9 is referred to as the optical isolator 9 in some cases. However, in the description herein, such strict classification is not used.

The optical component assembly assembled as described above can be joined to the optical communications package 11, which contains an optical element, via alignment adapters 12*a*, 12*b*, to form the optical transceiver module 3 according to an embodiment of the present invention. In the joining process, optical alignments are performed so that the optical element and the optical fiber 5 can be optically coupled to each other.

Alternatively, the sleeve 7 and the shell 8 may be secured to the optical component assembly first to assemble the optical receptacle 1, and thereafter, the optical receptacle 1 may be joined to the optical communications package 11, which contains an optical element, via the alignment adapters 12*a*, 12*b*. In this case as well, the optical receptacle 1 may be moved in the XYZ directions and, at the position where the optical element and the optical fiber 5 are optically coupled to each other, the alignment adapters 12*a*, 12*b* may be joined and secured to the tubular member 6 and to the optical communications package 11 by YAG laser welding, for example. In this manner, the optical communications transceiver module 3 according to an embodiment of the present invention is completed.

The optical receptacle 1 is completed by attaching the sleeve 7 and the shell 8 to the optical component assembly as described in the following example.

The sleeve 7 has a cylindrical shape, and the rear end (lower end in FIG. 1) portion thereof is secured to the front end 4*b* (upper end in FIG. 1) portion of the fiber stub 4 in such a manner as to cover the front end 4*b* portion. In the sleeve 7, the rear end portion has an inside diameter that allows the rear end portion to fit to the outer periphery of the fiber stub 4, and the front end portion has an inside diameter different from the inside diameter of the rear end portion, with a step disposed in between. For example, the rear end portion has an inside diameter that allows the rear end portion to fit to a 1.25 mm diameter ferrule and the front end portion has an inside diameter that allows the front end portion to fit to a 2.5 mm diameter ferrule. That is, the inside diameter of the front end portion is larger than the inside diameter of the rear end portion. Conversely, the sleeve 7 may be such that the inside diameter of the front end portion is smaller than the inside diameter of the rear end portion.

The front end 4*b* of the fiber stub 4 is located closer to the front end portion than the step between the rear end portion of 1.25 mm in diameter and the front end portion of 2.5 mm in diameter. That is, the front end 4*b* portion of the fiber stub 4 is located so as to be exposed within the front end portion.

The surface of the step may not be normal to the axis of the sleeve 7. For example, as illustrated in FIG. 3, the surface may be an inclined surface such that the inside diameter decreases from the front end portion toward the rear end portion. The front end 4*b* portion of the fiber stub 4 may be located so as to be exposed within the inclined surface.

Although not illustrated in the drawings, the distal end of a plug ferrule, through which an optical fiber is inserted, is inserted within the cylinder of the sleeve 7 at the front end (upper end in FIG. 1) portion, and the distal end surface is brought into abutment with the front end 4*b* surface of the fiber stub 4. Thus, the optical fiber 5 within the fiber stub 4 and the optical fiber within the plug ferrule are abutted against each other concentrically to couple the optical fibers to each other.

If the inside diameters of the front end portion and the rear end portion of the sleeve 7 are different from each other, the sleeve 7 is capable of receiving a plug ferrule having a diameter different from the diameter of the stub ferrule 4*c*.

If the sleeve 7, which has appropriate inside diameters, is employed, the optical receptacle 1 is connectable to a variety of plug ferrules.

The sleeve 7 is preferably a split sleeve 7 having a slit in an axial direction. The split sleeve 7 has an inside diameter slightly smaller than the outside diameter of the fiber stub 4 or a plug ferrule. When the fiber stub 4 or a plug ferrule is inserted thereinto from either end, the slit expands to enlarge the inside diameter of the split sleeve 7. Also, the elastic force of the split sleeve 7 holds the fiber stub 4 so as to position the fiber stub 4 and the plug ferrule in coaxial alignment. The elastic force of the sleeve 7 causes the sleeve 7 to be in close contact with the outer peripheral surfaces of the fiber stub 4 and the plug ferrule and to thereby hold the fiber stub 4 and the plug ferrule with a small clearance. As a result, the light propagating through the optical fibers, which is inserted through the fiber stub 4 and the plug ferrule, can be efficiently coupled.

FIGS. 2 and 3 illustrate a case in which the sleeve 7 has a slit in a lower portion thereof as viewed in the drawing.

As illustrated in FIGS. 1, 2, and 3, when the sleeve 7 has a fixed outside diameter and an inside diameter that is smaller at the rear end portion, the holding ability, when fitted to the fiber stub 4, may be enhanced. This is because the wall thickness of the sleeve 7 at the rear end portion is large and therefore the holding ability at the rear end portion may be enhanced. Moreover, even when a lateral force is applied to the sleeve 7, axial misalignment between the fiber stub 4 and the sleeve 7 is less likely to occur. As a result, the light output variations, so-called "wiggle characteristics", of the optical receptacle 1, which may be caused by displacement of the optical fiber coupling points, is improved. In addition, the length over which the fiber stub 4 and the sleeve 7 are fitted to each other can be reduced.

The sleeve 7 is preferably inserted until it reaches a position where the rear end surface abuts the front end surface of the protruding portion 6e. As described above, the sleeve 7 is closely secured to the fiber stub 4 with a small clearance and therefore cannot be easily disengaged. However, when it becomes necessary to replace the sleeve 7 after it is abutted and secured to the front end surface of the protruding portion 6e or to the front end surface of the tubular member 6, the sleeve 7 can be easily and safely detached by inserting a tool into a gap formed between the rear end surface of the sleeve 7 and the tubular member 6. For example, as can be seen from FIG. 2, the rear end surface of the sleeve 7 is abutted and secured to the front end surface of the protruding portion 6e. As a result, a gap is formed between the rear end surface of the sleeve 7 and the one end 6a of the tubular member 6, so that a tool can be inserted into the gap.

Furthermore, when the securement is carried out by abutment to the front end surface of the protruding portion 6e or to the front end surface 6a of the tubular member 6, control of the length of insertion of the sleeve 7 over the fiber stub 4 is facilitated.

The outside of the sleeve 7 is covered with the shell 8, which is used to protect the sleeve 7 and prevent the sleeve 7 from being fallen off from the fiber stub 4. The shell 8 may be formed from a resin or a metal. Resins have good moldability and are inexpensive and insulating, and therefore are suitable for the shell 8 according to the embodiment.

As illustrated in FIG. 2, the shell 8 includes L-shaped grooves 8c, each of which include a groove 8ca and a groove 8cb. The groove 8ca is formed adjacent to a rear end 8a and extends in an axial direction of the shell 8. The groove 8cb extends from the proximal end of the groove 8ca in a circumferential direction of the shell 8. The projections 6d of the tubular member 6 can be engaged with the grooves 8c to secure the shell 8 to the tubular member 6.

That is, the tubular member 6 and the shell 8 can be attached to each other by a method referred to as bayonet mounting. The projections 6d serve as pawls or radial pins and the grooves 8c serve as L-shaped slots. The projections 6d are brought into alignment with the ends of the grooves 8ca, which are formed in an axial direction, and the shell 8 is placed around the fiber stub 4 and the sleeve 7 and inserted along the axial direction. Then, when the projections 6d reach the proximal ends of the grooves 8ca, the shell 8 is rotated to slide the projections 6d along the circumferential grooves 8cb until the projections 6d reach the terminal ends of the grooves 8cb. The grooves 8cb, at the terminal ends of the grooves 8cb, are formed slightly wider toward the rear end of the shell 8 so as to receive and retain the projections 6d therein for securement.

Preferably, each of the grooves 8cb is slightly slanted in a direction such that the distance between the groove 8cb and the rear end 8a increases toward the terminal end from the connection point with the groove 8ca. With this configuration, as the shell 8 is rotated and secured, the rear end 8a surface of the shell 8 is pressed against the tubular member 6 to be firmly secured, and the resilient stress against the compressive force applied to the shell 8 acts as a spring force to secure the shell 8 to the tubular member 6.

The diameter of inner peripheral surface of the shell 8 is preferably larger than the diameter of the outer peripheral surface 6c of the tubular member 6 by 0.001 mm to 0.1 mm. With this configuration, a gap is formed between the outer peripheral surface 6c of the tubular member 6 and the inner peripheral surface of the shell 8. As a result of providing an appropriate gap as described above, the light output variations of the optical receptacle, the so-called wiggle characteristics, are improved.

In an example according to the embodiment, as illustrated in FIGS. 1 and 2, the shell 8 includes, at the rear end 8a portion, two flange-shaped protruding portions 8d, 8e. In the regions of the protruding portions 8d, 8e, the grooves 8c are formed in U-shaped bottomed grooves, while in the regions where the protruding portions 8d, 8e are not present, the grooves 8c are formed as slot-shaped holes. Thus, the groove 8c may be formed as a slot 8c bored from the inner surface of the shell 8 through to the outer surface thereof, or as in the embodiment, the groove 8c may be formed as a groove in some part, while formed as a slot for the rest. Of course, the groove 8c may be formed entirely of a groove.

Furthermore, the protruding portion 8e of the shell 8 includes a cutout 8ea. Because of the presence of the 8ea, the position of the groove 8c can be easily identifiable. In addition, the cutout 8ea can also serve as a marker for identifying the shell 8.

In some cases, a plurality of the optical receptacles 1 or the optical transceiver modules 3 may be used in parallel arrangement. For example, there may be cases in which, in an optical transceiver, two types of optical transceiver modules 3, namely, a transmitter optical subassembly (TOSA) and a receiver optical subassembly (ROSA), are arranged side by side for use. In such cases, if the shell 8 has an identifying marker, it is easy to identify which is the TOSA optical transceiver module 3 and which is the ROSA optical transceiver module 3. Furthermore, if the optical transceiver includes a plurality of channels, identification of a channel is facilitated by checking the shell 8.

The shell 8 is located at a position close to the coupling point of the optical receptacle 1, to which an optical connector containing a plug ferrule is to be connected, and therefore is suitable for formation of such a marker. Furthermore, the shell 8 can be attached last after the optical transceiver module 3 has been assembled. Thus, after the assembling of the optical transceiver is completed, an appropriate shell 8 can be attached in accordance with the intended use of the optical transceiver module 3, so as to be used for identification.

It is sufficient that the markers be distinguishable from one another, and various techniques may be used. For example, the marker regions may include printed letters or symbols. The letters or symbols may be in different colors to increase the distinguishability. The marker regions may include engraved letters or symbols, for example. The marker regions may include a label attached thereto including letters or symbols. The labels may have different background colors, or may have a combination of letters or symbols in different colors, for example, to be displayed.

As described above, the shell 8 is secured by engagement between the projections 6d and the groove 8c, but the shell 8 can be easily detached by releasing the engagement. Detachment can be carried out as follows. The shell 8 is rotated in a circumferential direction opposite to the direction for the securement of the shell 8, and when the projections 6d reach the point of connection to the groove 8ca, the shell 8 is pulled along an axial direction to thereby release the engagement between the groove 8c and the projections 6d.

Next, when the sleeve 7 is pulled out from the fiber stub 4, the front end 4b portion of the fiber stub 4 becomes exposed. Since the front end 4b portion of the fiber stub 4 can be easily exposed, cleaning of the front end 4b portion of the fiber stub 4 is greatly facilitated.

Furthermore, another sleeve 17, which has an inside diameter different from that of the sleeve 7, and another shell 18, which is used to cover and protect the sleeve 17, may be provided, and replacement may be carried out with these, and thereby, an optical receptacle may be reassembled. Thus, conversion to an optical receptacle 21 illustrated in FIG. 4 is easy. The optical receptacle 21 is capable of receiving a plug ferrule of a different diameter.

For example, a sleeve 17, which has inside diameters at the front portion and the rear end portion that allow fitting to a ferrule of 1.25 mm in diameter, and a shell 18, which is capable of covering and protecting the sleeve 17, may be used. Thus, the optical receptacle 21, which is connectable to optical connectors such as an LC type connector, can be obtained via conversion.

The optical receptacle 21, which is obtained via conversion as described above, can be readily reconverted back to the optical receptacle 1 or converted to another optical receptacle that can receive another plug ferrule.

The conversion operation can be carried out without any problems even after the optical receptacle 1 is assembled into the optical transceiver module 3 or even after it is assembled into an optical transceiver.

Next, with regard to the tubular member 6, the fiber stub 4, the sleeve 7, and the shell 8, which are included in the optical component assembly or the optical receptacle 1 according to the embodiment, examples of the materials and the production method for them will be described below.

The ferrule 4c, which is used for the fiber stub 4, is made of, for example, a metal, a plastics material such as an epoxy resin and a liquid crystal polymer resin, or a ceramic material such as alumina ceramics and zirconia ceramics. From the standpoint of mechanical properties, the ferrule 4c is preferably formed from zirconia ceramics. Specifically, the ferrule 4c is preferably made of partially stabilized zirconia ceramics, which are based on a tetragonal crystal. Such partially stabilized zirconia ceramics may contain $ZrO_2$ as a main component and at least one stabilizing agent. Examples of the stabilizing agent include $Y_2O_3$, CaO, MgO, $CeO_2$, and $Dy_2O_3$. Such partially stabilized zirconia ceramics exhibit excellent wear resistance and are suitably elastically deformable, and therefore advantageous in being secured to the tubular member 6.

The ferrule 4c of the fiber stub 4, if it is formed from zirconia ceramics, for example, can be produced in the following manner. A zirconia ceramic raw material is previously subjected to a predetermined molding process such as injection molding, pressing molding, or extrusion molding to obtain a molded body having a columnar shape or a parallelepiped shape. Thereafter, the molded body is subjected to firing at from 1300° C. to 1500° C., and then the outer peripheral surface is machined or polished to the predetermined dimensions of the ferrule 4c. Alternatively, machining, for example, may be performed prior to firing on the molded body to previously form a predetermined shape, and the firing may be performed thereafter.

For the purpose of reducing the splice loss between the front end surface 4b of the fiber stub 4 and a plug ferrule of an optical connector, the front end surface 4b of the fiber stub 4 is mirror polished to have a curved surface with a radius of curvature of approximately 5 mm to 30 mm. The rear end surface 4a, together with the optical fiber 5, is polished to be an inclined surface inclined at from approximately 4° to 10° with respect to a plane perpendicular to the axis of the fiber stub 4, in order to prevent the generation of reflected light, i.e., light emitted from an optical element, e.g., a laser diode (LD), and reflected on the end surface of the optical fiber 5, to return to the optical element.

The sleeve 7 is made of a material such as zirconia ceramics, alumina ceramics, or copper, for example. In view of wear resistance predominantly, a ceramic material such as zirconia ceramics is used in many cases. In the case of using a ceramic material such as zirconia, for example, a processing method such as injection molding is performed to produce a cylindrical molded body, which is to be formed into the sleeve 7. Thereafter, the molded body is fired at from 1300° C. to 1500° C. and is ground or polished to predetermined dimensions. The inner shape, which has different inside diameters at the front end portion and the rear end portion, is desirably obtained by previously forming an approximate shape in injection molding. Then, in the post-processing after firing, processing is performed to obtain the predetermined inside diameters. In the case of the sleeve 17 illustrated in FIG. 4, which has a constant inside diameter, extrusion molding, for example, can be used.

The sleeve 7 may be formed by two separate parts. For example, a tubular part of 1.25 mm in inside diameter and 2.5 mm in outside diameter and a split sleeve of 2.5 mm in inside diameter may be combined to form the sleeve 7. The tubular part is to be fitted to the fiber stub 4 and the split sleeve is to cover the tubular part.

The inside diameter of the front end portion of the sleeve 7 is determined depending on the outside diameter size of the plug ferrule of an optical connector to be inserted into the sleeve 7. A plug ferrule used in an MU type or LC type optical connector has an outside diameter of approximately 1.25 mm, a plug ferrule used in an SC type, FC type, or ST type optical connector has an outside diameter of approximately 2.5 mm, and a plug ferrule used in a D4 type optical connector has an outside diameter of approximately 2.0 mm.

The inside diameter of the front end portion of the sleeve 7 is sized so that the front end portion can fit to a plug ferrule.

In the case where the sleeve 7 is a split sleeve 7, a machining process is performed after firing to form a slit in an axial direction. Furthermore, the surface roughness of the inside of the sleeve 7 is desirably not greater than 0.2 μm in arithmetic mean roughness (Ra) in view of ease of insertion. Furthermore, the tolerance between the outside diameter of the fiber stub 4 and the inside diameter of the sleeve 7 is desirably not greater than ±1 μm in order to reduce the splice loss. The inside diameter dimension of the sleeve 7 is desirably designed to result in an insertion force of not less than 0.98 N in order to reliably retain the fiber stub 4.

The tubular member 6 is made of a material such as stainless steel, copper, iron, nickel, plastics, zirconia ceramics, or alumina ceramics, for example. From the standpoint of workability and elasticity, use of a metal material is preferred, and a stainless steel material is often used. The processing method for production may be, for example, to machine a metal material having an outside diameter larger than that of the tubular member 6 using a lathe, for example.

The shell 8 is made of a plastics material such as polyetherimide, polysulfone, or polyphenylene sulfide, for example, or a metal material such as a stainless steel material, copper, iron, or nickel, for example. From the standpoint of formability, the shell 8 preferably includes plastics material such as polyetherimide, described above, and is formed by injection molding.

As for the optical component assembly, the rear end 4a of the fiber stub 4 is press-fitted into the inner hole of the tubular member 6 and secured by applying pressure to the front end 4b of the fiber stub 4. The inner hole of the tubular member 6 includes, near the one end 6a, a region having an outside diameter larger than that of the fiber stub 4, so that the press-fitting length of the fiber stub 4 is adjusted.

Furthermore, assembling to the optical receptacle 1 can be carried out as follows. The sleeve 7 is mounted to the front end 4b of the fiber stub 4, and the shell 8 is placed onto the sleeve 7 so as to cover the sleeve 7 and inserted as described above to be secured by bayonet mounting.

Subsequently, the alignment adapters 12a, 12b are joined to the tubular member 6 of the optical component assembly or the optical receptacle 1 and the element of the optical element-containing optical communications package 11 is secured. In this manner, the optical communications transceiver module 3 according to the present invention is produced. Before joining the alignment adapters 12a, 12b, the optical receptacle 1 or the optical component assembly is moved in the XYZ directions to the position where the optical element in the optical communications package 11 and the optical fiber 5 are optically coupled to each other, and thereafter the alignment adapters 12a, 12b are joined by YAG laser welding, for example, to be secured. In this manner, the optical communications transceiver module 3 according to the present invention is completed.

According to the present invention, the optical receptacle 1 and the optical communications transceiver module 3 include the optical component assembly, and the shell 8 can be secured to the projections 9d of the optical component assembly. The shell 8 can be easily attached and detached or replaced, and also, the sleeve 7 can be easily attached and detached or replaced. If a foreign object on the front end portion of the fiber stub 4 is to be removed, the shell 8 and the sleeve 7 can be detached to expose the fiber stub 4 so that the foreign object that is deposited on the inside can be sufficiently cleaned off.

Furthermore, detachment of the shell 8 and the sleeve 7 and replacement with another sleeve 17 and another shell 18 having different inside diameters are easy. The replacement can be performed even after incorporation into the optical communications transceiver module 3 or a communication device. Thus, the optical receptacle 1 and the optical communications transceiver module 3, for which conversion at a work site for coupling an optical connector is facilitated, are provided.

The invention is not limited to the above-described embodiments and examples, and various modifications may be made to the embodiments and examples without departing from the scope of the invention. For example, in one example of the above-described embodiment, the mode of using the optical component assembly in the optical receptacle 1 has been described. However, the mode is not limited to this. For example, the optical component assembly may be used in an optical receptacle-type optical connector configured to have the function of the sleeve, for example. The optical connector is to be coupled to the optical communications transceiver module 3.

In the description of the above embodiment, the terms "upper", "lower", and "lateral" are used merely for the purpose of illustrating the positional relationships in the drawings, and are thus not intended to represent actual positional relationships in practical use.

REFERENCE SIGNS LIST

1 Optical receptacle
2 Optical element housing portion
3 Optical communications transceiver module
4 Light guide member (fiber stub)
4a One end
4b Other end
5 Optical fiber
6 Tubular member
6a One end
6b Other end
6c Outer peripheral surface
6d Projection
6e Protruding portion
7 Sleeve
8 Shell
8a Rear end
8b Front end
8c Groove
8d, 8e Protruding portions
9 Optical isolator
9a Polarizer
9b Faraday rotator
9c Analyzer
10 Magnet
11 Optical communications package
12a, 12b Alignment adapter
17 Another sleeve
18 Another shell
21 Another optical receptacle

The invention claimed is:

1. An optical receptacle comprising:
an optical component assembly comprising:
a light guide member; and
a tubular member retaining the light guide member in a through hole of the tubular member, wherein the tubular member comprises at least one projection not located on an outer peripheral surface of the tubular member, extending outward of the outer peripheral surface of the tubular member at one end and extending in an axial direction and in a direction of a sleeve of the tubular member thereof;

the sleeve having a tubular shape and fitted to an outer periphery of the light guide member at a rear end portion of the sleeve, the sleeve having an inside diameter at a front end portion different from an inside diameter at the rear end portion; and a shell having a tubular shape and covering an outer peripheral surface of the sleeve, the shell comprising a groove in a rear end portion of the shell, the groove extending in the axial direction and turning and extending in a circumferential direction, and the groove being engaged with the at least one projection of the tubular member to secure the shell.

2. The optical receptacle according to claim 1, wherein the inside diameter of the front end portion of the sleeve is sized to allow the front end portion to fit to a 2.5 mm diameter ferrule.

3. The optical receptacle according to claim 2, wherein the inside diameter of the rear end portion of the sleeve is sized to allow the rear end portion to fit to a 1.25 mm diameter ferrule.

4. The optical receptacle according to claim 1, wherein the light guide member comprises a fiber stub comprising a ferrule and an optical fiber inserted through the ferrule.

5. An optical communications transceiver module comprising:
the optical receptacle according to claim 1; and
an optical communications package secured to the tubular member and comprising an optical element inside of the optical communications package.

6. A method for producing an optical receptacle, the method comprising:
rotating the shell of the optical receptacle according to claim 1 in a circumferential direction and thereafter pulling the shell in the axial direction to release engagement between the at least one projection of the optical component assembly and the groove of the shell;
then pulling out the sleeve;
then mounting another sleeve to the light guide member, the another sleeve having an inside diameter different from the inside diameters of the sleeve; and
then engaging a groove disposed in a rear end portion of another shell with the at least one projection of the optical component assembly, wherein the another shell covers the another sleeve, and the rear end portion of the another shell and the rear end portion of the shell have a similar shape, to thereby assemble another optical receptacle via conversion.

7. A method for producing an optical receptacle, the method comprising:
rotating the another shell of the optical receptacle according to claim 6 in the circumferential direction and thereafter pulling the another shell in the axial direction to release engagement between the at least one projection of the optical component assembly and the groove of the another shell;
then pulling out the another sleeve;
then mounting the sleeve to the light guide member; and
then engaging the groove of the shell with the at least one projection of the optical component assembly.

* * * * *